(12) United States Patent
Salta (10) Patent No.: US 11,181,243 B2
(45) Date of Patent: Nov. 23, 2021

(54) RUGGED FLEXIBLE LED LIGHTING PANEL

(71) Applicant: GLOWGADGET, LLC, Riva, MD (US)

(72) Inventor: Shane Salta, Riva, MD (US)

(73) Assignee: GLOWGADGET, LLC, Riva, MD (US)

( * ) Notice: Subject to any disclaimer, the term of this patent is extended or adjusted under 35 U.S.C. 154(b) by 0 days.

(21) Appl. No.: 17/257,456

(22) PCT Filed: Jul. 3, 2019

(86) PCT No.: PCT/US2019/040582
§ 371 (c)(1),
(2) Date: Dec. 31, 2020

(87) PCT Pub. No.: WO2020/010243
PCT Pub. Date: Jan. 9, 2020

(65) Prior Publication Data
US 2021/0231271 A1    Jul. 29, 2021

Related U.S. Application Data

(60) Provisional application No. 62/693,795, filed on Jul. 3, 2018.

(51) Int. Cl.
| | |
|---|---|
| *F21S 4/22* | (2016.01) |
| *F21V 15/01* | (2006.01) |
| *F21V 21/08* | (2006.01) |
| *F21V 23/00* | (2015.01) |
| *F21Y 105/10* | (2016.01) |

(Continued)

(52) U.S. Cl.
CPC .............. *F21S 4/22* (2016.01); *F21V 15/012* (2013.01); *F21V 21/08* (2013.01); *F21V 23/003* (2013.01); *F21Y 2105/10* (2016.08); *F21Y 2107/70* (2016.08); *F21Y 2115/10* (2016.08); *H05K 1/189* (2013.01)

(58) Field of Classification Search
None
See application file for complete search history.

(56) References Cited

U.S. PATENT DOCUMENTS

| | | |
|---|---|---|
| 4,408,185 A | 10/1983 | Rasmussen |
| 5,640,069 A | 6/1997 | Nilssen |

(Continued)

*Primary Examiner* — Alan B Cariaso
(74) *Attorney, Agent, or Firm* — Berenato & White, LLC (57) ABSTRACT

Flexible lighting panel includes a substrate with a conductor pattern and apertures, solid-state light emitters electrically connected to the conductor pattern, a light-transmissive first protective layer covering at least a portion of a first surface of the substrate, and a second protective layer covering at least a portion of a second surface of the substrate. The first and second protective layers are joined to one another through the apertures and the periphery of the substrate to assist in maintaining the light-transmissive first protective layer and the second protective layer against the first and second surfaces of the substrate, respectively. One or both of the first and second protective layers encapsulate the solid-state light emitters. The lighting panel is flexible to allow opposite edges of the lighting panel to be folded over on one another and/or the lighting panel to be rolled into a tubular configuration.

20 Claims, 10 Drawing Sheets

(51) Int. Cl.
*F21Y 115/10* (2016.01)
*F21Y 107/70* (2016.01)
*H05K 1/18* (2006.01)

(56) References Cited

U.S. PATENT DOCUMENTS

| | | | |
|---|---|---|---|
| 6,229,271 B1 | 5/2001 | Liu | |
| 6,469,457 B2 | 10/2002 | Callahan | |
| 7,893,528 B2 | 2/2011 | Chen et al. | |
| 8,007,155 B2 | 8/2011 | Bolander, Jr. et al. | |
| 8,033,684 B2 | 10/2011 | Marshall et al. | |
| 8,130,085 B2 | 3/2012 | Noh | |
| 8,201,974 B1 | 6/2012 | Smith et al. | |
| 8,288,958 B2 | 10/2012 | Rinaldi | |
| 8,373,547 B2 | 2/2013 | Benya et al. | |
| 8,779,686 B2 | 7/2014 | Jin | |
| 8,988,008 B2 | 3/2015 | Seward, IV | |
| 9,029,878 B2 | 5/2015 | Sabathil et al. | |
| 9,240,706 B2 | 1/2016 | Patel et al. | |
| 9,265,103 B2 | 2/2016 | Lynch et al. | |
| 9,276,633 B2 | 3/2016 | Chen et al. | |
| 9,328,874 B2 | 5/2016 | Demuynck et al. | |
| 9,587,808 B2 | 3/2017 | Speer et al. | |
| 9,608,507 B2 | 3/2017 | Houde et al. | |
| 9,765,935 B2 | 9/2017 | Rowlei, Jr. et al. | |
| 9,799,811 B2 | 10/2017 | Maki | |
| 9,869,456 B2 | 1/2018 | Speer et al. | |
| 9,905,545 B2 | 2/2018 | Maki | |
| 10,096,581 B2 | 10/2018 | Maki | |
| 10,097,228 B2 | 10/2018 | Cramer | |
| 10,132,478 B2 | 11/2018 | Vasylyev | |
| 10,222,036 B2 | 3/2019 | Dubuc | |
| 10,288,229 B2 | 5/2019 | Steele et al. | |
| 10,302,280 B2 | 5/2019 | Ayel | |
| 10,317,053 B2 | 6/2019 | Dunn et al. | |
| 10,886,849 B2 | 1/2021 | Owshanko | |
| 2001/0050372 A1 | 12/2001 | Krun et al. | |
| 2004/0223328 A1 | 11/2004 | Lee et al. | |
| 2007/0217200 A1 | 9/2007 | Yang et al. | |
| 2008/0252430 A1 | 10/2008 | Lester | |
| 2009/0091934 A1 | 4/2009 | Lin | |
| 2010/0061093 A1 | 3/2010 | Janssen et al. | |
| 2012/0126281 A1 | 5/2012 | Shaikevitch et al. | |
| 2014/0369038 A1* | 12/2014 | Tischler | G09F 13/00 362/235 |
| 2015/0235552 A1 | 8/2015 | Cai et al. | |
| 2016/0013376 A1 | 1/2016 | Maki | |
| 2016/0076708 A1 | 3/2016 | Shirilla | |
| 2016/0320037 A1* | 11/2016 | Wong | H05K 1/038 |
| 2017/0154920 A1* | 6/2017 | Ono | H01L 33/62 |

* cited by examiner

RUGGED FLEXIBLE LED LIGHTING PANEL

CROSS-REFERENCE TO RELATED APPLICATIONS AND CLAIM OF PRIORITY

This application claims the benefit of priority of U.S. Provisional Application No. 62/693,795 filed in the U.S. Patent & Trademark Office on Jul. 3, 2018, the complete disclosure of which is incorporated herein by reference.

FIELD OF THE INVENTION

This invention relates to a flexible lighting panel including solid-state light emitters (e.g., LEDs) that may serve as a primary light source while providing flexibility, durability, and light weight. In particularly exemplary embodiments of the invention, the lighting panel is suitable for military applications, including deployment from a compact or stowed (e.g., rolled) state into a deployed state for use as the primary light source, such as in military pop-up tents. In another particularly exemplary embodiment, the lighting panel is suitable for civilian applications, where a portable, flexible and durable light source may be desired, e.g., while camping. This invention further relates to a lighting fixture including a support structure and the flexible lighting panel mounted/mountable on the support structure.

BACKGROUND

Lighting panels are generally known. In some cases, known lighting panels have flexibility to them. However, repeated flexing and unflexing of the lighting panels can cause separation or delamination of different layers and parts from one another.

SUMMARY OF THE INVENTION

According to a first aspect of the invention, a flexible lighting panel is provided that includes a substrate with a conductor pattern and one or more apertures, solid-state light emitters electrically connected to the conductor pattern, a light-transmissive first protective layer covering at least a portion of a first surface of the substrate, and a second protective layer covering at least a portion of a second surface of the substrate. The first and second protective layers are directly joined to one another through the one or more apertures to assist in maintaining the light-transmissive first protective layer and the second protective layer against the first and second surfaces of the substrate, respectively. One or both of the first and second protective layers encapsulate the solid-state light emitters. The lighting panel is sufficiently flexible to allow opposite edges of the lighting panel to be folded over on one another and/or the lighting panel to be rolled into a tubular configuration.

A second aspect of the invention provides a lighting fixture including at least a flexible lighting panel and a support structure. The flexible lighting panel includes a substrate with a conductor pattern and one or more apertures, solid-state light emitters electrically connected to the conductor pattern, a light-transmissive first protective layer covering at least a portion of a first surface of the substrate, and a second protective layer covering at least a portion of a second surface of the substrate. The first and second protective layers are directly joined to one another through the one or more apertures to assist in maintaining the light-transmissive first protective layer and the second protective layer against the first and second surfaces of the substrate, respectively. One or both of the first and second protective layers encapsulate the solid-state light emitters. The lighting panel is sufficiently flexible to allow opposite edges of the lighting panel to be folded over on one another and/or the lighting panel to be rolled into a tubular configuration. The support structure is configured to mount the flexible lighting panel and sufficiently rigid to maintain the flexible lighting panel in a planar state.

Other aspects of the invention, including apparatus, devices, assemblies, sub-assemblies, kits, processes, methods, and the like which constitute part of the invention, will become more apparent upon reading the following detailed description of the exemplary embodiments.

BRIEF DESCRIPTION OF THE DRAWING(S)

The accompanying drawings are incorporated in and constitute a part of the specification. The drawings, together with the general description given above and the detailed description of the exemplary embodiments and methods given below, serve to explain the principles of the invention. In such drawings.

DETAILED DESCRIPTION OF THE EXEMPLARY EMBODIMENTS AND EXEMPLARY METHODS

Reference will now be made in detail to exemplary embodiments and methods of the invention. It should be noted, however, that the invention in its broader aspects is not necessarily limited to the specific details, representative materials and methods, and illustrative examples shown and described in connection with the exemplary embodiments and methods. Like reference numerals designate like parts throughout the drawings.

Figure 1:
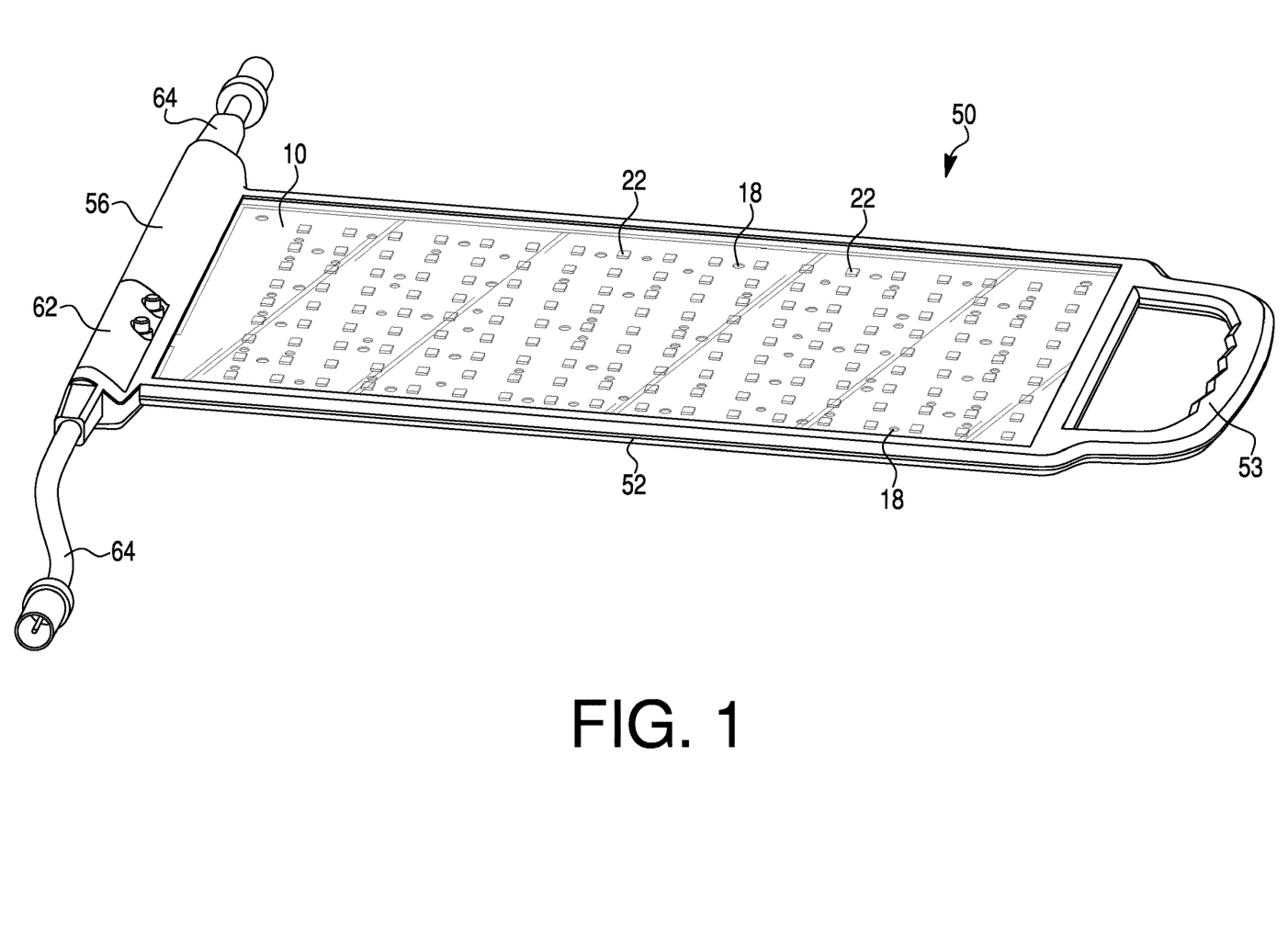
FIG. 1 is a perspective view of a lighting fixture according to an embodiment of the invention.

Referring now more particularly to the drawings, an exemplary embodiment of a lighting fixture is generally designated by reference numeral 50 in FIG. 1. The light fixture 50 includes a flexible lighting panel 10. In FIG. 1, the lighting panel 10 is illustrated with a generally rectangular perimeter. It should be understood that the lighting panel 10 may possess other configurations, including those of a square, triangle, polygonal, circle, ellipsoid, annular, random shapes, etc.

Flexible Substrate 12

As best shown in FIGS. 2A, 2B, 3A, 3B, and 4, the lighting panel 10 includes a flexible substrate 12 having opposite first and second surfaces 14 and 16. The first and second surfaces 14 and 16 are parallel and coextensive with one another.

Desirable properties of the flexible substrate 12 include high flexibility and good thermal conductivity and thermal distribution to ensure that solid-state light emitters 22 (discussed below) remain cool for efficiency and operations in extreme temperature environments. The flexible substrate 12 can be made of various materials or combinations of materials, including, for example, a polyimide copper flex sheet, a flexible printed circuit board (PCB), polyethylene naphthalate, polyethylene terephthalate, polytetrafluoroethylene, fluorocarbon, aramid, polyester, paper, or a combination thereof. Polyimide copper flex is particularly useful because of its high strength.

The flexible substrate 12 may be reflective, such as by providing the first surface 14 and/or the second surface 16 of the flexible substrate 12 with a reflective film or coating, and/or incorporating a reflective material into the body of the flexible substrate 12. For example, the first surface 14 and/or the second surface 16 may be bright white or reflective, such as a mirror-like silver surface.

The flexible substrate 12 includes one, two, three, four, or more apertures 18 extending through the flexible substrate 12 from the first surface 14 to the second surface 16. While the apertures 18 are illustrated as through holes having a circular appearance when viewed from above the first surface 14 or below the second surface 16, it should be understood that the apertures 18 may undertake any other shape. For example, the shapes of the apertures 18 may be configured as slits, slots, polygons, random shapes, etc., or a combination thereof. The apertures 18 are shown within the outer perimeter of the flexible substrate 12. However, the apertures 18 may intersect the perimeter of the flexible substrate 12 so as to open on one or more edges of the substrate 12. For example, one or more of the apertures 18 may have a C-shape or V-shape with its wider end intersecting the periphery of the flexible substrate 12. The apertures 18 can be formed by cutting, puncturing, hole punching, in-situ molding, and/or other operations.

Conductor Pattern 20

Figure 6:
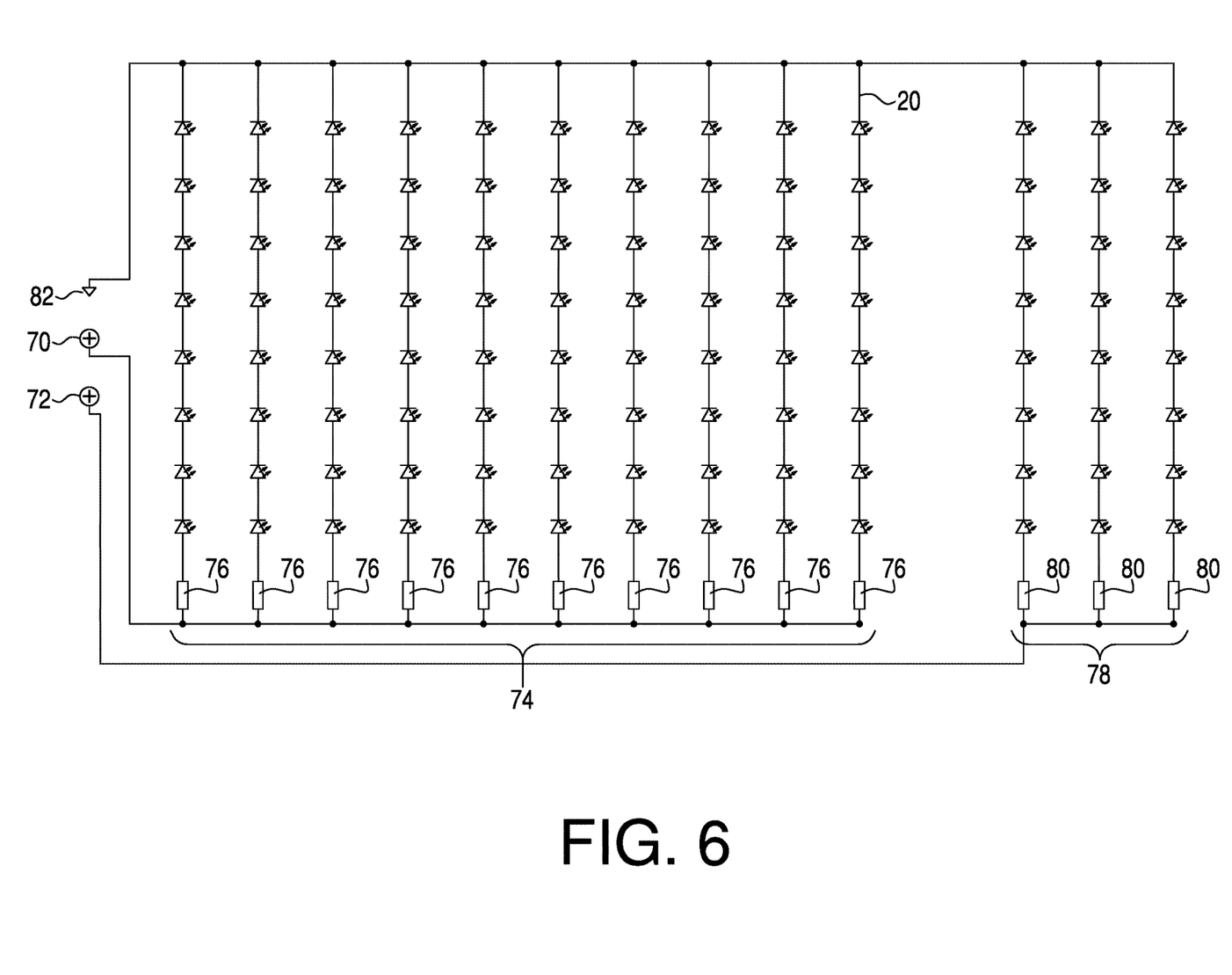
FIG. 6 is a circuit diagram for the lighting fixture according to an exemplary embodiment.

The flexible substrate 12 further includes a conductor pattern (e.g., conductive traces) 20 as seen in FIG. 6. The conductor pattern 20 is typically on the first surface 14 of the flexible substrate 12, but alternatively may be on the second surface 16, the first and second surfaces 14 and 16, and/or between the first and second surfaces 14 and 16. The flexible substrate 12 preferably is a flexible printed circuit board containing the conductor pattern 20. The conductor pattern 20 carries electricity to the solid-state light emitters 22 (described in greater detail below).

The conductive traces 20 may be, for example, printed silver ink, carbon nanotubes or nanoparticles, silver, graphene, copper, gold, wires, etc. Companies such as DuPont, T-Ink, and Tekra supply conductive inks. Depositing of the conductive traces 20 may be performed using an additive method, a subtractive method, such as acid wash, electrodeposition, spin coating, chemical vapor deposition (CVD), or a combination of these or other methods. Optionally, and particularly applicable in the case of conductive inks selected as the conductor pattern 20, the conductor pattern 20 has a sheet resistivity of less than 30 mil$\Omega$·mil, preferably 10-15 m$\Omega$·mil.

Solid-State Light Emitters 22

The lighting panel 10 further includes a plurality of solid-state light emitters 22 supported on the flexible substrate 12. The solid-state light emitters 22 are preferably light emitting diodes (or "LEDs"). Other solid-state light emitters may be used in addition to or as alternatives for LEDs, including organic light-emitting diodes (OLEDs), polymer light-emitting diodes (PLEDs), or a combination thereof. In the interest of brevity, the solid-state light emitters 22 are often exemplified herein and are illustrated in the drawings as LEDs. However, it should be understood that OLEDs, PLEDs, other solid-state light emitting semiconductor devices, and combinations thereof may likewise be used.

Micro solid-state light emitters 22, especially micro-LEDs, are preferred, although larger LEDs may be used. Micro-LEDs are preferred and particularly effective for controlling and dissipating heat. Micro solid-state light emitters 22 preferably have a maximum dimension of 5 to 3,000 microns, more preferably 1,000 microns.

The solid-state light emitters 22 can be applied to the flexible substrate 12 using any suitable technique, such as transfer or microcontact printing (e.g., PDMS stamping), laser driven printing (e.g., laser lift off), photolithography, electromagnetic or electrostatic self-assembly, flexographic printing, screen printing, pick-and-place, etc.

The solid-state light emitters 22 are electrically connected to the electrical conductor pattern 20. Any suitable connection (e.g., solder joints or electrically conductive adhesive) may be used to electrically connect the solid-state light emitters 22 to the electrical conductor pattern 20. The light emitters 22 may be soldered to the first surface 14 of the flexible substrate 12. Alternatively, an electrically conductive adhesive may be used for bonding using thermal radiation, ultraviolet radiation, magnetic activation, or other techniques.

The solid-state light emitters 22 of the lighting panel 10 may include light emitters of different wavelengths and/or different colors from one another. The solid-state light emitters 22 may be grouped into different arrays, for example, according to the color or wavelength of emitted light, to permit multiple modes of operation. The conductor pattern 20 may comprise a plurality of pathways or traces, with each of the pathways interconnecting the solid-state light emitters 22 of the same array to one another and to a driver to drive the solid-state light emitters 22. The conductor pattern 20 may connect and allow driving of the solid-state light emitters 22 of an array in series, in parallel, in series/parallel, or in other suitable circuit configurations.

The plurality of pathways or traces may allow for independent control of the LED arrays for operating the lighting panel 10 in different modes. In this manner, light emitters 22 of a first LED array may be operated in an on-state while light emitters 22 of a second LED array are in an off-state. The traces 20 associated with different arrays of light emitters 22 may cross one another by providing a dielectric/insulating layer at the crossing to act as a bridge, keeping the traces 20 of the different arrays of light emitters 22 electrically isolated from one another.

According to one exemplary embodiment best illustrated in the circuit diagram of FIG. 6, first and second voltage/power sources 70 and 72 are provided. The first voltage source 70 drives a first array of solid-state light emitters 74 configured to emit light of a first color (e.g., white). The solid-state light emitters 74 are arranged in a plurality of strings (in series) that are parallel to one another, with a first resistor 76 provided for each string. The second voltage source 72 drives a second array of solid-state light emitters 78 configured to emit light of a second color (e.g., green). The LED driver can divide the incoming power, or one or more switches may be provided for switching the incoming power between the first voltage source 70 and the second voltage source 72. Alternatively, both power sources 70 and 72 may be active at the same time.

The solid-state light emitters 78 are arranged in a plurality of strings (in series) that are parallel to one another, with a second resistor 80 provided for each string. Both of the arrays 74 and 78 are connected to a ground terminal 82. The first array 74 may contain the same number of a different number of solid-state light emitters than the second array 78. The circuitry may include other components, such as additional resistors, capacitors, drivers, etc. Further, the circuitry may omit components shown in FIG. 6, such as resistors.

According to another exemplary embodiment, the lighting panel 10 is configured as a single array. According to another embodiment, the plurality of solid-state light emitters 22 comprises a first array of solid-state light emitters configured to emit blackout light compatible with night-vision-goggle use and a second array of light emitters configured to emit light of a color other than the blackout light. The circuit diagram of FIG. 6 may be useful for this alternative embodiment.

Where multiple arrays are present, the solid-state light emitters 22 of the arrays may differ from one another in other ways. For example, the solid-state light emitters of a first array may have a different forward voltage than the forward voltage of the solid-state light emitters of a second array. Different drivers may be dedicated to each of the separate arrays. The design and layout of the solid-state light emitters of the first array may different from the design and layout of the solid-state light emitters of the second array. The power line(s) and/or control line(s) associate with the first array may differ from the power line(s) and/or control line(s) of the second array.

Light emitters 22 typically emit blue or ultraviolet light. The emitted light can be converted to other colors, such as white, red, green, etc. using phosphors and other light-converting materials. The phosphors or other materials may be contained in the light emitters 22 or in protective layers 24 and 26 (discussed below).

Alternative circuits to the diagram shown in FIG. 6 may be used. For example, the lighting panel 10 may contain a single array of solid-state light emitters. Alternatively, more than two arrays of solid-state light emitters can provide lighting modes of three or more colors or wavelengths.

The solid-state light emitters 22 can be packaged or unpackaged, although packaged LEDs are preferred. The LEDs preferably are lateral LEDs, i.e., with the LED anode and cathode in the same x-y plane for electrical connecting to the conductor patterns 20, although it is possible yet less preferred to use vertical LEDs (VLEDs), which have their anode and cathode in the same z-plane. The LEDs also are preferably top-emitting, so that light emitted by the top-emitting LEDs is directed away from the substrate 12 and does not require redirection. The solid-state light emitters 22 may all be top-emitting and arranged to emit light in the same direction, i.e., unidirectional lighting.

The light emitters 22 may be uniformly distributed over the two-dimensional plane of the flexible substrate 12. Sufficient spacing between light emitters (LEDs) 22 is desirable to optimize for strain tolerance so that the light emitters 22 do not interfere with each other when the panel 10 is flexed, while providing excellent heat dissipation. Heat dissipation helps to avoid low quantum efficiencies, short lifetimes, and emission wavelength shifts. Small LEDs, such as the micro-LEDs mentioned above, can distribute heat resulting in greater than a twofold decrease in thermal resistance, ensuring uniform current injection, reduced series resistance, and reduced self-heating of the panel 10. Spatial separation will depend upon the size of the solid-state light emitters 22. Smaller spacing is preferred for smaller solid-state light emitters 22, while larger spacing is preferred for larger size solid-state light emitters 22.

A non-limiting example of a suitable LED for use as the solid-state light emitters 22 is Lumiled Luxeon® 2835 3V LEDs used with Seoul Semiconductor Co., Ltd.'s Seoul NanoDriver® LED driver. It should be understood that different solid-state light emitters 22 (e.g., LEDs) with different forward voltages and different LED drivers may be used.

Protective Layers 24 and 26

As best shown in FIGS. 2A, 2B, 3A, 3B, and 4, the lighting panel 10 further includes a flexible first protective layer (or overlay) 24 covering at least a substantial portion, and optionally all, of the first surface 14 of the flexible substrate 12, and a flexible protective second layer (or underlay) 26 covering at least a substantial portion, and optionally all, of the second surface 16 of the flexible substrate 12.

One or both of the first and second protective layers 24 and 26 fully encapsulate the solid-state light emitters 22 to enhance the resistance, including the water-resistance and dirt-resistance, of the panel 10. In the drawings, the light emitters 22 are shown encapsulated by the first protective layer 24. Additionally, the first and second protective layers 24 and 26 preferably both extend at least to the perimeter of the flexible substrate 12, and preferably beyond the perimeter of the flexible substrate 12. According to an exemplary embodiment, the first and second protective layers 24 and 26 collectively cover and encapsulate all of the solid-state light emitters 22 and all of the first and second surfaces of the flexible substrate 12, except optionally an electrical connection portion 15 (see FIGS. 4 and 5) of the flexible substrate 12 configured to be electrically connected to at least one of a driver circuit, a power source, a logic circuit, or a combination thereof, as discussed further below. The encapsulation of all or mostly all (except for the electrical connection portion 15) of the flexible substrate 12 and the light emitters 22 makes the lighting panel 10 especially suitable for outdoor use, including military or camping uses such as tent lighting.

The first protective layer 24 encapsulating the light emitters 22 is light transmissive, more preferably optically transparent, to permit light emitted from the light emitters 22 to travel beyond the first protective layer 24 with minimal or no loss in light transmissivity. It should be understood that the first protective layer 24, the second protective layer 26, or both the first and second protective layers 24 and 26 are preferably light transmissive.

The first and second protective layers 24 and 26 also are preferably flexible and capable of absorbing stresses associated with flexing of the lighting panel 10. The first protective layer 24 and the second protective layer 26 may be made of the same as or different materials than one another. Desirable properties of the protective layers 24 and 26 include high optical transparency for the light emitted by the light emitters 22, good adhesion to the light emitters 22 and the flexible substrate 12, durability, and scratch resistance. The first and/or second protective layers 24 and 26 may comprise, for example, an acrylic, epoxy, polyurethane (PU), silicone, poly(p-xylylene) (e.g., PARYLENE™ C coating of Specialty Coating System, Inc.), polyethylene terephthalate (PET), or a combination or blend thereof, such as a blend of PU and PET. Additionally, the first and/or second protective layers 24 and 26 may be made of the same material as or a different material from the flexible substrate 12.

Figure 2A:
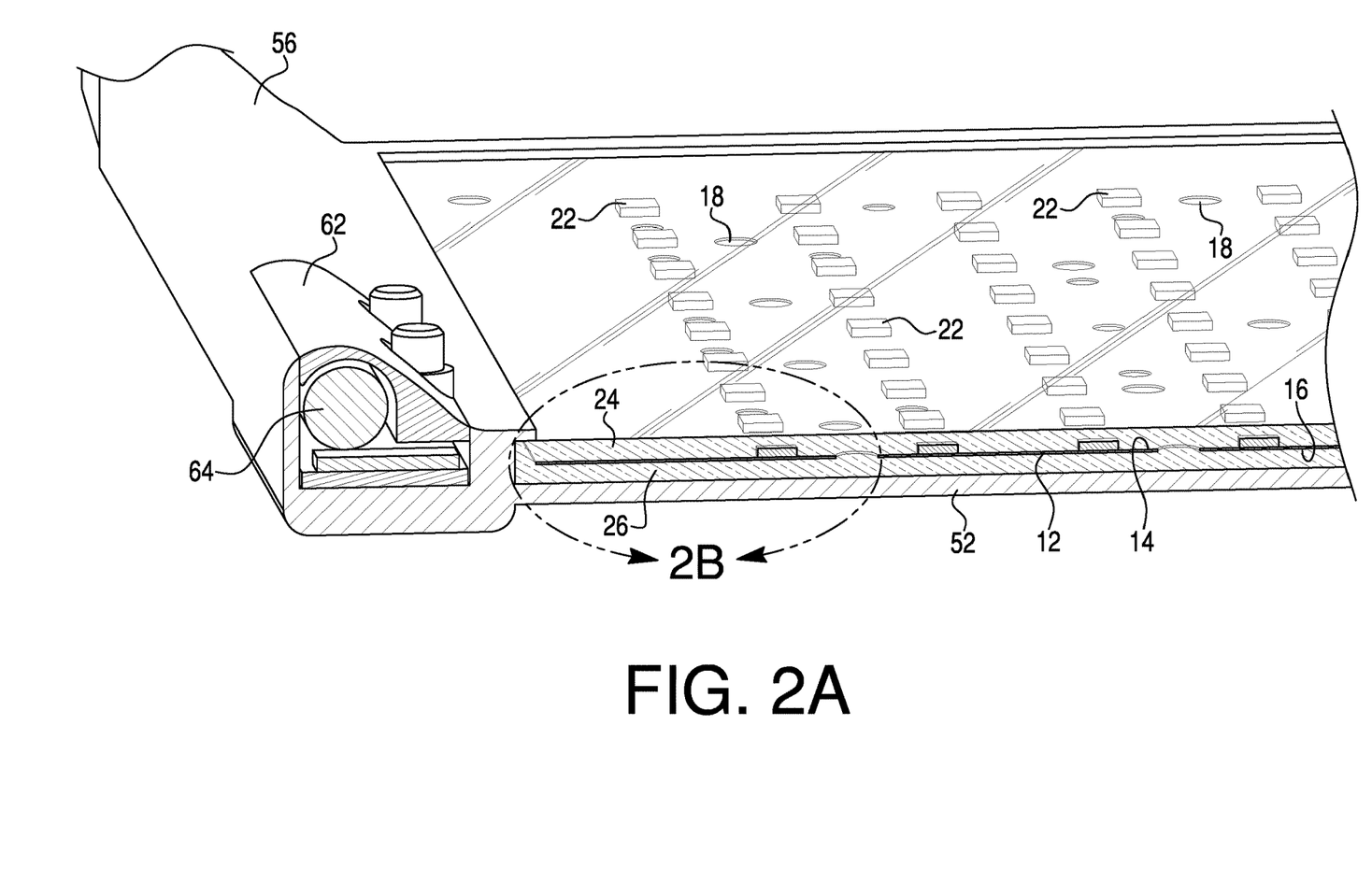
FIG. 2A is a fragmented, sectional perspective view of the lighting fixture of FIG. 1.
Figure 2B:
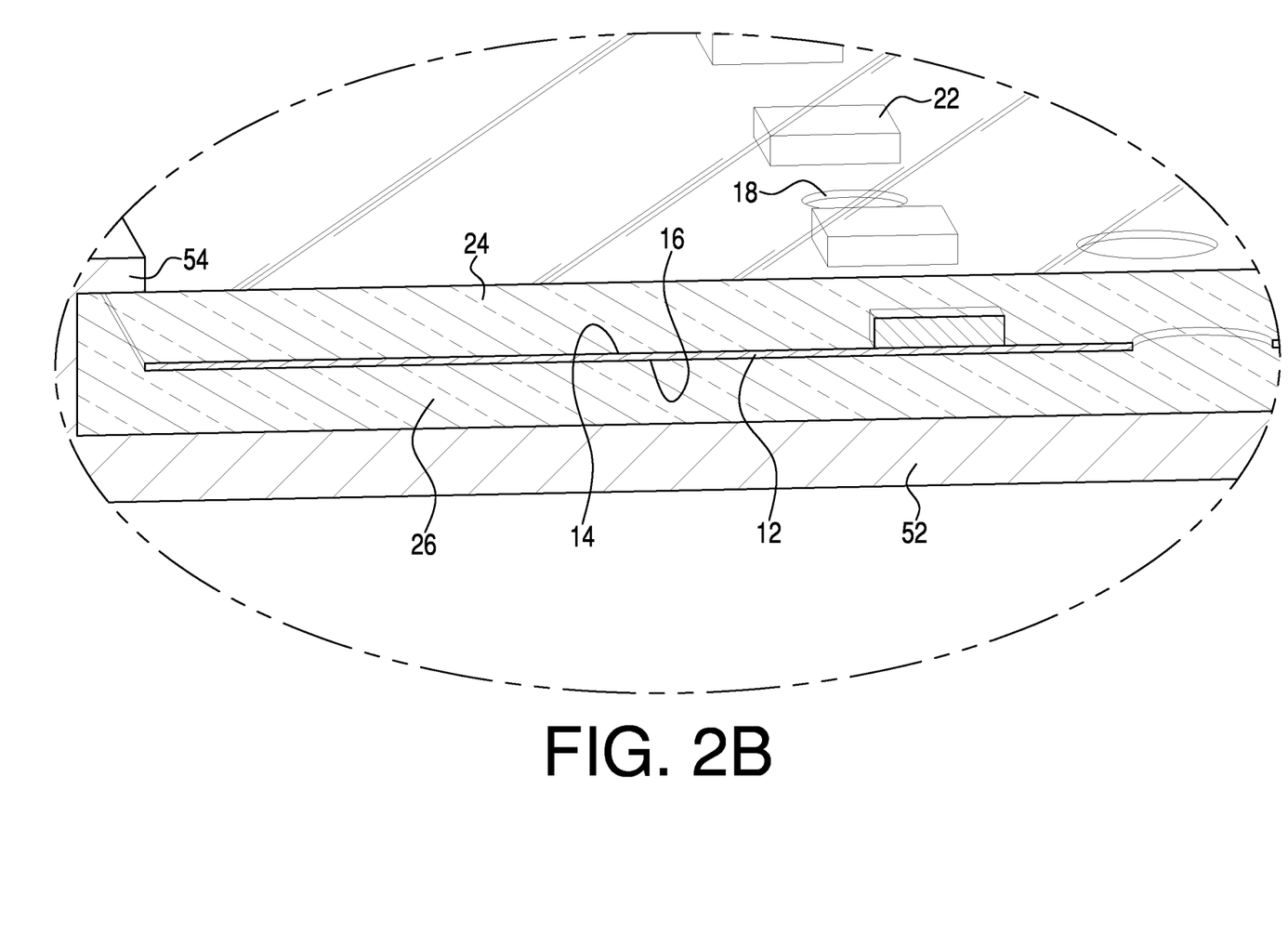
FIG. 2B is an enlarged fragmented view of the area within the broken line 2B of FIG. 2A.

Although the lighting panel 10 is described as including the first and second protective layers 24 and 26, it should be understood that the protective layers 24 and 26 may appear as and constitute a single uniform (common) layer, such that the protective layers 24 and 26 are visually indistinguishable from one another, except that a portion of the uniform protective layer is adjacent to the first surface 14 of the flexible substrate 12 (i.e., the first protective layer 24), and another portion of the single uniform protective layer is adjacent to the second surface 16 of the flexible substrate 12 (i.e., the second protective layer 26). This exemplary embodiment is best shown in FIGS. 2A and 2B. The formation of the protective layers 24 and 26 as a single uniform (common) layer can be accomplished, for example, by placing the flexible substrate 12 supporting the light emitters 22 in a mold cavity, and injection molding a curable and/or hardenable composition into the mold cavity to surround the flexible substrate 12 and the light emitters 22. As shown in FIGS. 2A and 2B, the injection molded material will also fill the apertures 18 to join and fuse the first and second protective layers 24 and 26 to each other via links passing through the flexible substrate 12. The injection molded composition is allowed to harden and/or cure.

According to another exemplary embodiment, the first protective layer 24 and the second protective layer 26 are both pre-formed and applied to the opposite surfaces 14 and 16 of the flexible substrate 12 supporting the light emitters 22. The first and second protective layers 24 and 26 may be separately applied to opposite sides of the flexible substrate 12, for example, in a mold, and heated under pressure to at least partially melt and fuse with one another around the periphery of the flexible substrate 12. High molding temperatures cause the material of either or both of the first and second protective layers 24 and 26 to fill the apertures 18 of the flexible substrate 12 to create links or unions through the apertures 18 and around the periphery of the flexible substrate 12, as best shown in FIGS. 2A and 2B. These unions assist in maintaining the first protective layer 24 and the second protective layer 26 against the first and second surfaces 14 and 16 of the flexible substrate 12, respectively.

Figure 3A:
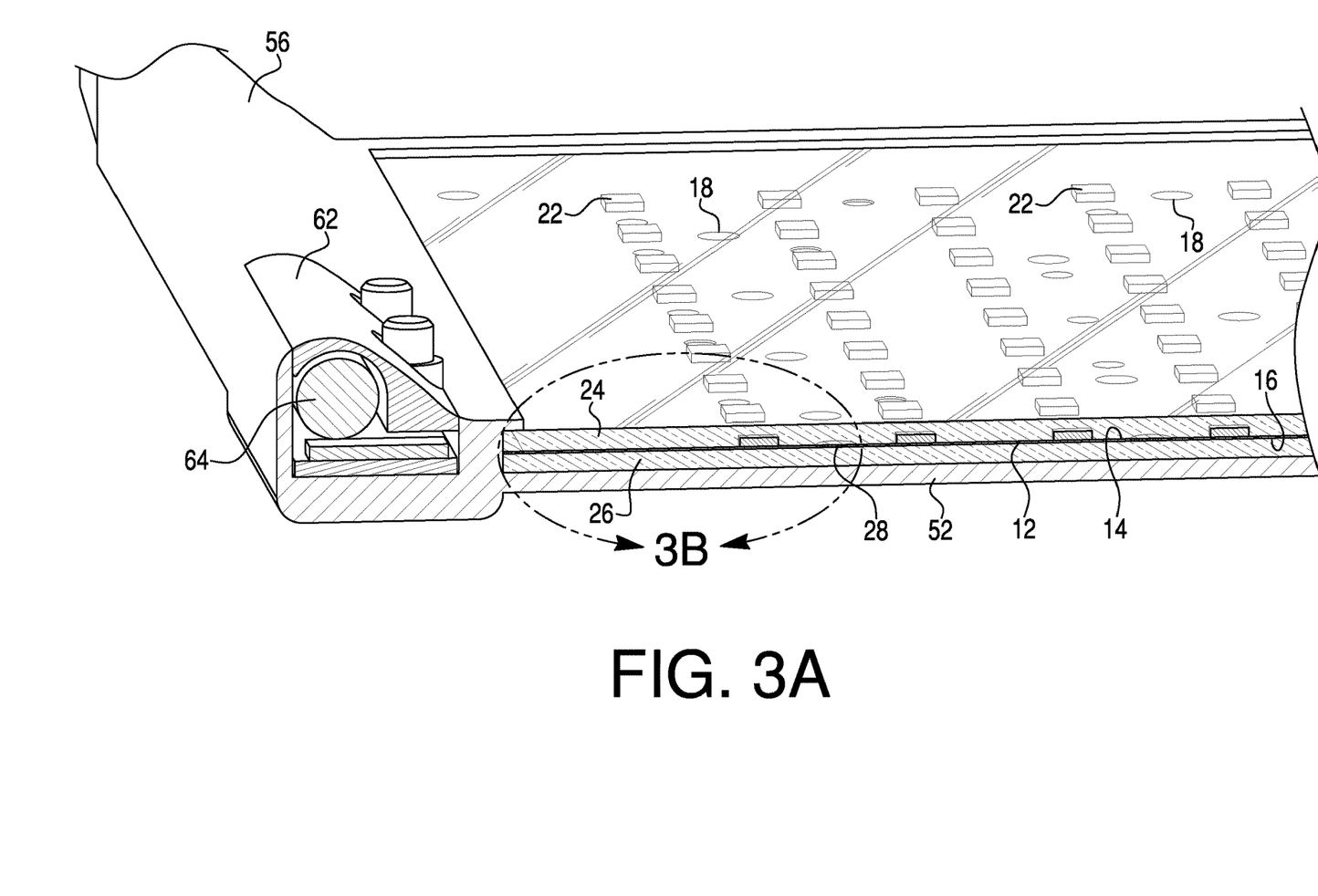
FIG. 3A is a fragmented, sectional perspective view of a lighting fixture according to a modified embodiment.
Figure 3B:
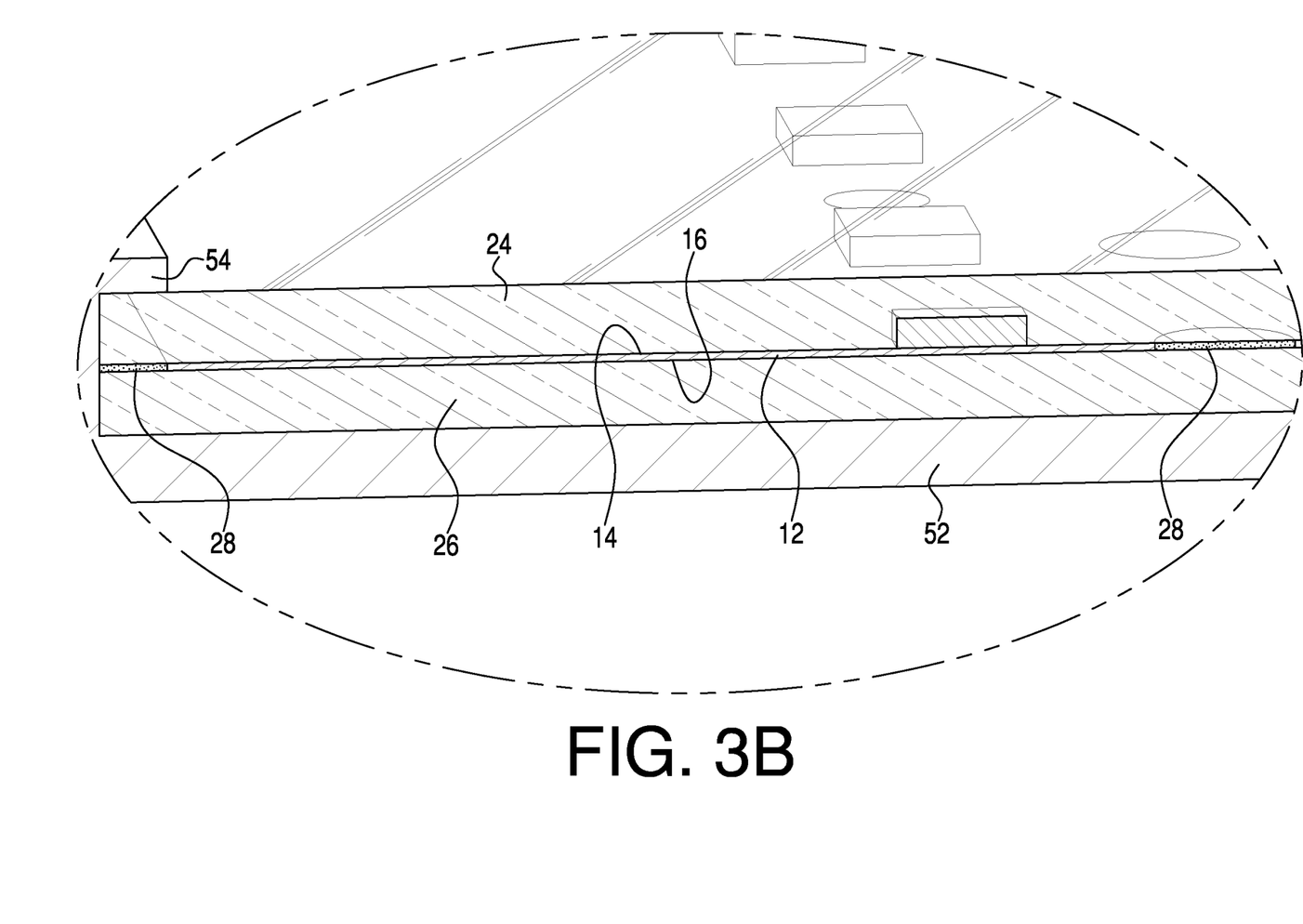
FIG. 3B is an enlarged fragmented view of the area within the broken line 3B of FIG. 3A.

According to another exemplary embodiment best illustrated in FIGS. 3A and 3B, the first protective layer 24 and the second protective layer 26 are glued or otherwise adhered to the opposite surfaces 14 and 16 of the flexible substrate 12 with the light emitters 22 mounted on the flexible substrate 12. The glue or adhesive 28 fills the apertures 18 of the flexible substrate 12 to create links or unions through the apertures 18 and around the periphery of the flexible substrate 12 that assist in maintaining the first protective layer 24 and the second protective layer 26 against the first and second surfaces 14 and 16 of the flexible substrate 12, respectively. Edges of the first and second protective layers 24 and 26 extending beyond the periphery of the substrate 12 may likewise be adhered to one another with glue or adhesive 28.

The molding process may be carried out to incorporate additional features into the lighting panel 10. For example, the first protective layer 24 and/or the second protective layer 26 may be molded in mold die to form handles or wire connections. Alternatively, pre-formed handles and/or wire connections may be placed in the mold cavity prior to molding. According to another embodiment, handles and/or wire connections can be added after molding, such as by using an adhesive or carrying out an additional molding step.

The first protective layer 24, the second protective layer 26, or both the first and second protective layers 24 and 26 may include optical elements to alter the light beam pattern, color, or wavelength of light emitted from the light emitters 22 or optimize utilization of the light emitted from the light emitters 22. For example, the protective layers 24 and/or 26 may incorporate phosphorus (fluorescent) particles, quantum dots, tint, light-scattering optics, light-diffusing optics, or light-redirecting optics, or a combination thereof. Also, a separate light diffusing layer can be applied over the first protective layer 24 (and/or the second protective layer 26) to affect the optical properties of light emitted from the lighting panel 10. Additional space (or a gap) may be incorporated in the first protective layer 24 above the light emitters 22, or between the top of the first protective layer 24 and a diffusion layer, for better diffusion. Spaces or gaps above the light emitters 22 can be created by first forming the first protective layer 24 in a mold with cutouts for the light emitters 22 including an air gap, then placing the first protective layer 24 above the light emitters 22 and the second protective layer 24 below the substrate 12.

Optional Additional Layers and Components

The lighting panel 10 may include additional layers adjacent to the flexible substrate 12. For example, an additional thermally conductive layer or layers may be positioned adjacent to the first surface 14 and/or the second surface 16 to assist in heat removal. Representative thermal conductive materials that may be incorporated into the thermally conductive layer(s) include, for example, diamond, carbon nanotubes, graphene, aluminum, copper, silver gold, other conductive metals, or a combination thereof. However, in an exemplary embodiment, the lighting panel 10 does not include (that is, is "free of") a separate heat sink.

As another modification, holes can be formed in the flexible substrate 12 under solid-state light emitters 22 to provide a path for conducting heat away from the light emitters 22. After the light emitters 22 are mounted partly in or above the holes, the holes are filled from their bottom with a thermally conductive material that will transfer heat away from the light emitters 22. Thermally conductive fillers include, for example, diamond, carbon nanotubes, graphene, aluminum, copper, silver gold, other conductive metals, or a combination thereof to transfer heat away from the light emitters 22. For example, the adhesive 28 of FIGS. 3A and 3B can include such thermally conductive material(s).

Stiffeners made of rigid material may be incorporated into or placed on the first and/or second surfaces 14 and 16 to provide bend protection in areas where bending is unwanted, such as for rigid components, solder joints, and the like. The stiffener may be silicone rubber, metal, a resin, etc. that is less flexible than the substrate 12. Further, cuts or slots may be formed in either or both of the first and second surfaces 14 and 16 to facilitate bending and flexing of the flexible substrate 12. The stiffeners may be formed by, for example, injection molding a rubber and/or silicone that is less flexible or has a higher hardness rating, applying resin to the substrate or components, and/or placing metal or other stiff objects above or below the substrate 12 prior to overmolding.

One or more optically opaque thermal conductors can be provided on the first surface 14 of the flexible substrate 12 between the light emitters 22, beneath the light emitters 22, and/or on the opposite second surface 16 of the flexible substrate 12. The thermal conductors may be textured, for example, with grooves or extrusions, to improve heat dissipation. Further, thermal vias can be formed in the flexible substrate 12 underneath or adjacent to the light emitters and filled with a thermal conductor. Thermal pottants may also be included for heat control.

The lighting panel 10 may also include unfilled/empty through holes extending from the exterior surface of the first protective layer 24 to the exterior surface of the second protective layer 26. Such unfilled/empty through holes can be used for mounting the lighting panel, for example, to the roof or walls of a popup tent. The holes may be circular, square, slots, slits, or other shapes.

Figure 7:
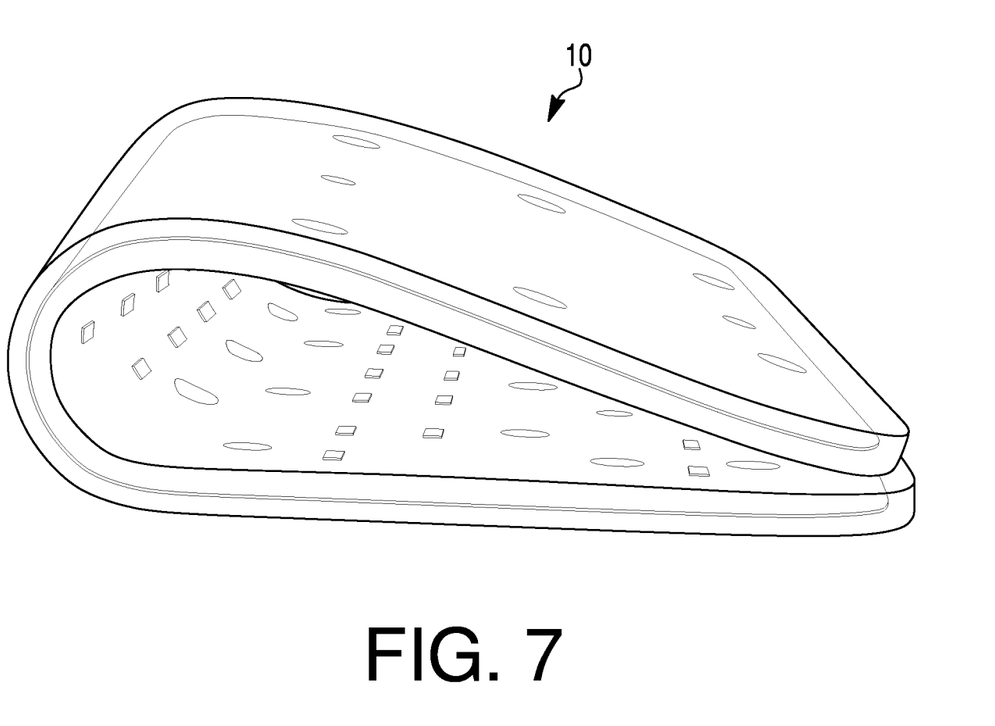
FIG. 7 is a perspective view of a lighting panel folded over on itself.
Figure 8:
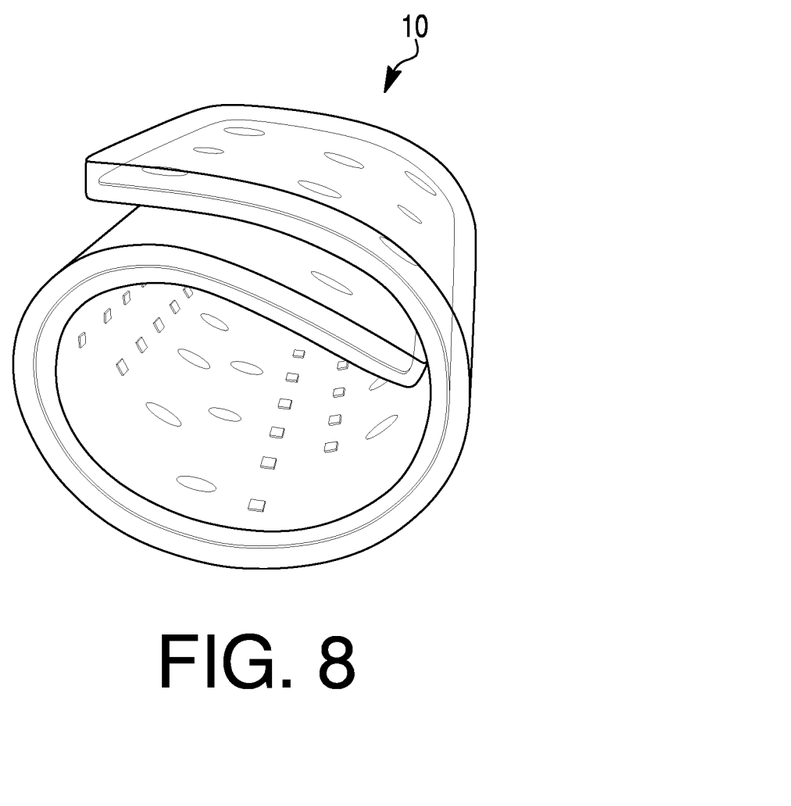
FIG. 8 is a perspective view of a lighting panel rolled into a tubular configuration.

The flexible first and second protective layers 24 and 26 and the flexible substrate 12 collectively have sufficient flexibility to permit opposite edges of the solid-state lighting panel 10 to be folded over on one another, as shown in FIG. 7, and/or to permit rolling of the lighting panel 10 into a tubular configuration, as shown in FIG. 8. Such flexibility makes the lighting panel 10 easily stowable and deployable for various applications, including military and camping uses, including as the primary light source for the interior of a tent. For example, one or more lighting panels 10 can be unrolled or unfolded and hung, pinned, suspended, or otherwise connected to the walls and/or roof of the interior of a tent.

The lighting panel 10 may incorporate hook-and-loop (e.g., Velcro)® or other fasteners for retaining the panel 10 in a folded or rolled stowed state. Alternative fasteners include magnets, snaps, straps, and other fasteners. Power wiring (discussed below) can be incorporated into the fasteners to save space and improve compactness.

Exemplary Properties and Characteristics of Lighting Panel 10

According to an exemplary embodiment, the flexible substrate 12 is positioned in an imaginary neutral plane of the lighting panel 10. More specifically, the first protective layer 24 has an exterior surface facing away from the first surface 14 of the flexible substrate 12 and the second protective layer 26 has an exterior surface facing away from the second surface 16 of the flexible substrate 12. The flexible substrate 12 is positioned in an imaginary neutral plane of the flexible solid-state lighting panel 10 that is equidistance from the exterior surfaces of the first and second protective layers 24 and 26. In accordance with this embodiment, the first and second protective layers 24 and 26 can have identical thicknesses. This configuration reduces or avoids strain on the flexible substrate 12 during flexing, bending, folding, and/or rolling of the lighting panel 10.

The flexible panel 10 may possess various shapes and sizes. For example, the flexible panel 10 may have a thickness (measured between the exterior surfaces) of, for example, about 0.5 mm to about 25.0 mm, more preferably about 3.0 mm to about 7.0 mm. The surface area (length by width) of the flexible panel 10 will be dictated by intended use, but may be in a range of, for example, 0.1 ft$^2$ to 4 ft$^2$, preferably 0.5 ft$^2$ to 1 ft$^2$. The protective layers 24 and 26 preferably have a thickness at least as thick as the height of the largest solid-state light emitter 22, such as on the order of about 1 mm to about 5 mm, preferably about 1 mm to about 3 mm. The flexible substrate 12 preferably has a thickness on the order of about 0.04 mm to about 0.4 mm. The flexible panel 10 may have a weight on the order of, for example, preferably less than 5 lbs, more preferably less than 3 lbs, and even more preferably less than 1 lb.

The light output of the lighting panel 10 may be, for example, about 10 lumens to about 2600 lumens, although higher outputs of, for example, up to about 5000 lumens or higher, are possible. The light transmissivity of the protective layers, particularly the first protective layer 24, affects the efficiency of light output. Preferably, the protective layers, especially the first protective layer 24, result in no more than a 5% loss of lumen output relative to the output of the solid-state light emitters 22.

The lighting panel 10 preferably meets military standards, including illumination levels as specified in MIL-STD-1472F and low electromagnetic interference (EMI) emission according to MIL-STD-461.

Preferably, the lighting panel 10 is made of parts and components that are stable and operable over a wide range of external temperatures, such as −40° F. (4.4° C.) to 125° F. (51.7° C.), and are storable without damage at temperatures in a range of, for example, −50° F. (10.0° C.) to 160° F. (71.1° C.). Silicone, for example, can function over wide temperature ranges and in many environments.

Lighting Fixture

Figure 4:
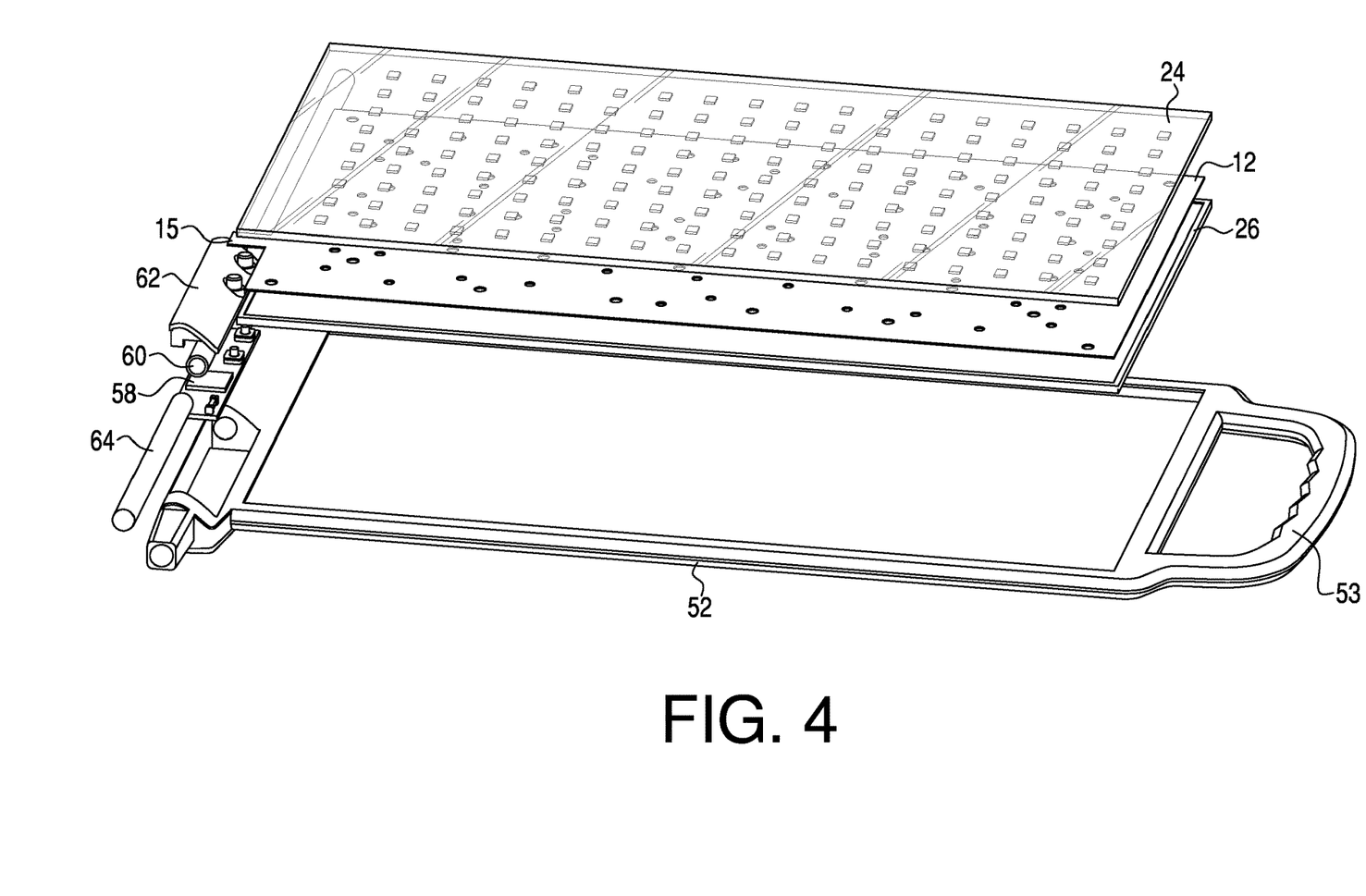
FIG. 4 is a disassembled view of the lighting fixture of FIG. 1.

The lighting panel 10 is shown incorporated into a lighting fixture 50 in FIG. 1. The lighting fixture 50 includes a panel support structure 52, which is embodied in the drawings as a planar board having a handle 53, as best shown in FIGS. 1 and 4. The drawings illustrate the lighting fixture 50 with a single lighting panel 10 mounted on the planar board 52. However, it should be understood that the panel support structure 52 and the lighting panel 10 may be sized proportionally to allow mounting of two, three, four, or more lighting panels 10 on a single panel support structure 52. As best shown in FIGS. 2A, 2B, 3A and 3B, the panel support structure 52 may include an overhang 54 for retaining the lighting panel 10 in place. The distance between the planar area of the panel support structure 52 and the overhang 54 is preferably substantially the same as the thickness of the lighting panel 10. The panel support structure 52 preferably is sufficiently rigid to maintain the flexible solid-state lighting panel in a fully deployed and extended state, preferably a planar state.

Figure 5:
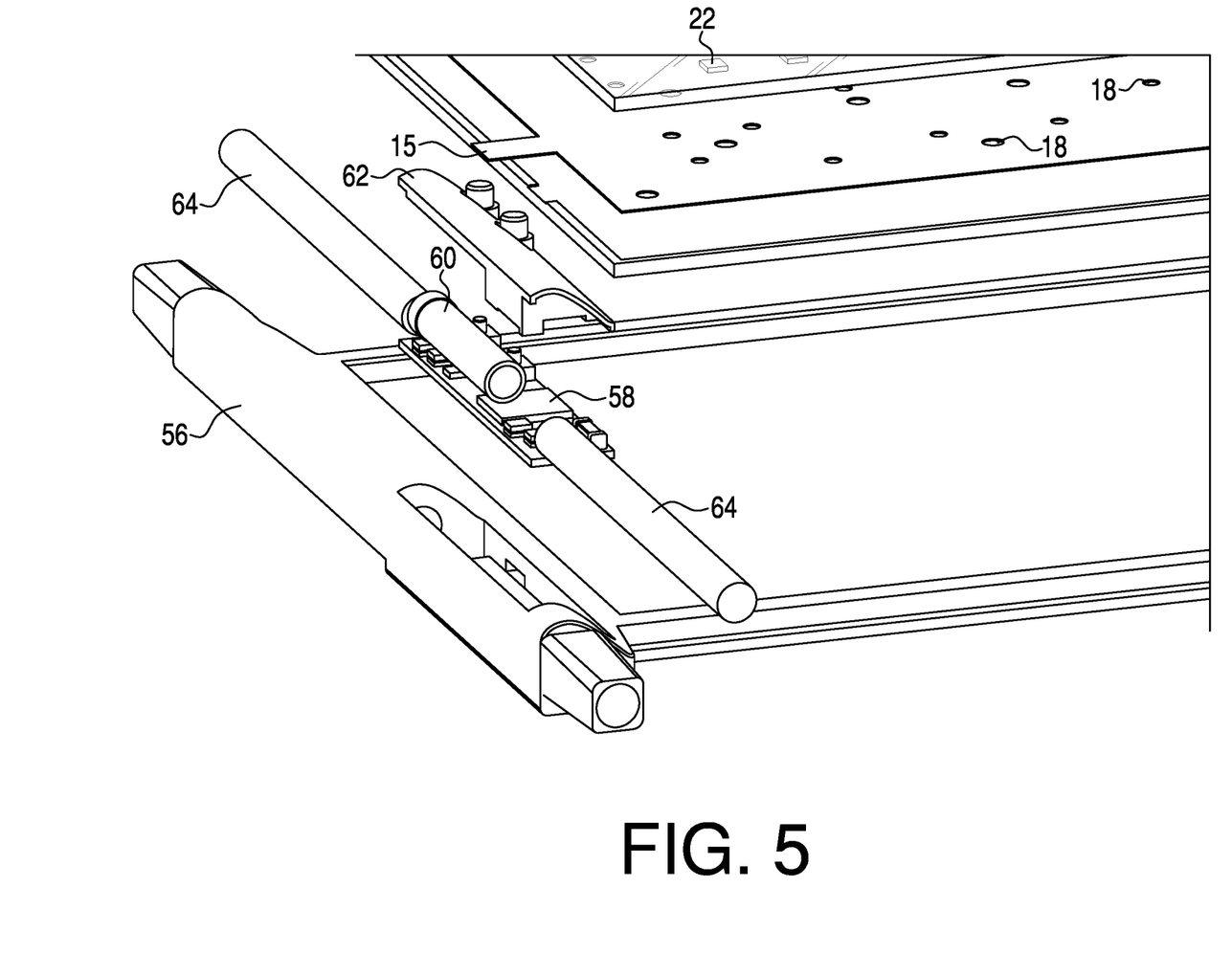
FIG. 5 is a fragmented, disassembled view of the lighting fixture of FIG. 1.

The lighting fixture 50 further includes a housing 56. Electrical components/modules and the like useful for operating the lighting panels 10 may be housed in the housing 56. As best shown in FIG. 5, the housing 56 contains a driver board/driver module 58 with a capacitor 60 mounted above the driver board/module 58. The driver board/module 58 electrically connects to the electrical connection portion 15 of the flexible substrate 12. This connection may be achieved by soldering. The driver circuit can be configured to switch between different colors by activating and deactivating different arrays using internal logic. Logic can be driven by a local switch or by external control signals via the powerline, wireless signals, or wired signals.

LED drivers typically rectify higher voltage and protect the LEDs from voltage or current fluctuations. For some applications, it may be desirable to incorporate a logic controller and/or switch for controlling functions such as switching between on-off operation, dimming, and changing between light output color. Such components may be incorporated into the LED drivers, incorporated into the lighting panel 10, or provided externally. A receiver or transceiver module can also be incorporated into the housing 56 to allow remote operation of the lighting fixture 50 using radio frequency (RF) or other transmissions. A removable cover 62 encloses the driver 58, the capacitor 60, and other electronic components.

A cord 64 leads to and from opposite sides of the driver board/module 58 for delivering constant voltage or constant current to the lighting panel 10. The lighting panel 10 preferably can be operated to run off of an alternating current (e.g., 120 VAC 50/60 Hz), such as from a wall electrical outlet the cord 64 can be plugged into. Typically, the LED driver will act as a rectifier. Nonetheless, alternative embodiments are possible in which a recitifier (or AC/DC converter) may be incorporated into the housing 56 or provided external to the lighting fixture 50.

The lighting panel 10 can also be configured to run off of direct current (e.g., 12-24 VDC) power supply, such as a battery. A DC power supply external to the lighting fixture 50 may be used. Alternatively, an internal DC power supply (incorporated into the housing 56 or directly into the lighting panel 10) can be used.

The cord 64 preferably is configured with male and female plugs/connectors to permit daisy chaining of multiple lighting fixtures 50 for powering multiple lighting panels from a single electrical power source. For example, one, two, three, or more (e.g., up to fifteen) lighting panels can be daisy chain connected to one another. The connectors can be, for example, standard NEMA connectors, non-proprietary and proprietary DC power connectors, etc. The cords may contain at least one positive and at least one negative wire, but may include additional wires for additional control over the solid-state light emitters (e.g., LEDs) 22. Suitable connectors include Brad Harrison ip67 connectors and Molex connectors.

The various components and features of the above-described exemplary embodiments may be substituted into one another in any combination. It is within the scope of the invention to make the modifications necessary or desirable to incorporate one or more components and features of any one embodiment into any other embodiment. In addition, although the exemplary embodiments discuss steps performed in a particular order for purposes of illustration and discussion, the methods discussed herein are not limited to any particular order or arrangement. One skilled in the art, using the disclosures provided herein, will appreciate that various steps of the methods can be omitted, rearranged, combined, and/or adapted in various ways.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. This description is not necessarily intended to be exhaustive or to necessarily limit the invention to the precise embodiments disclosed.

What is claimed is:

1. A flexible lighting panel, comprising:
a substrate comprising opposite first and second surfaces, a conductor pattern, and one or more apertures extending through the substrate from the first surface to the second surface;
a plurality of solid-state light emitters electrically connected to the conductor pattern;
a light-transmissive first protective layer covering at least a portion of the first surface of the substrate; and
a second protective layer covering at least a portion of the second surface of the substrate, the first protective layer and the second protective layer being directly joined to one another through the one or more apertures of the substrate to assist in maintaining first protective layer and the second protective layer against the first and second surfaces of the substrate, respectively, one or both of the first protective layer and/or the second protective layer encapsulating the solid-state light emitters, the first and second protective layers and the substrate collectively having sufficient flexibility to permit opposite edges of the flexible lighting panel to be folded over on one another and/or to permit rolling of the flexible lighting panel into a tubular configuration.

2. The flexible lighting panel of claim 1, wherein the first protective layer and the second protective layer are joined with one another through the apertures of the substrate by thermal fusing of the first and second protective layers together.

3. The flexible lighting panel of claim 1, further comprising adhesive joining the first protective layer and the second protective layer to one another through the apertures of the substrate.

4. The flexible lighting panel of claim 1, wherein the substrate comprises a polyimide copper flex sheet.

5. The flexible lighting panel of claim 1, wherein the substrate comprises a flexible printed circuit board.

6. The flexible lighting panel of claim 1, wherein the substrate comprises polyethylene naphthalate, polyethylene terephthalate, polytetrafluoroethylene, fluorocarbon, aramid, polyester, paper, or a combination thereof.

7. The flexible lighting panel of claim 1, wherein:
the first protective layer has an exterior surface facing away from the first surface of the substrate and the second protective layer has an exterior surface facing away from the second surface of the substrate, the exterior surfaces of the first and second protective layers being on opposite sides of the flexible lighting panel relative to one another; and
the substrate is in an imaginary neutral plane of the flexible lighting panel equidistance from the exterior surfaces of the first and second protective layers.

8. The flexible lighting panel of claim 1, wherein the first surface of the substrate is reflective.

9. The flexible lighting panel of claim 1, wherein the substrate further includes a thermally conductive material, the thermally conductive material comprising diamond, carbon nanotubes, graphene, aluminum, copper, silver gold, other conductive metals, or a combination thereof.

10. The flexible lighting panel of claim 1, wherein the solid-state light emitters comprise semiconductor light-emitting diodes (LEDs).

11. The flexible lighting panel of claim 1, wherein the plurality of solid-state light emitters further comprises a first array of light emitters configured to emit blackout light compatible with night-vision-goggle use and a second array of light emitters configured to emit light different from the blackout light.

12. The flexible lighting panel of claim 1, wherein the plurality of solid-state light emitters further comprises a first array of light emitters configured to emit white light and a second array of light emitters configured to emit a different light color than the first array of light emitters.

13. The flexible lighting panel of claim 1, wherein the light-transmissive first protective layer and the second protective layer comprise, independently of one another, an acrylic, epoxy, polyurethane, silicone, poly(p-xylylene), or a combination thereof.

14. The flexible lighting panel of claim 1, wherein the first and second protective layers cover all of the first and second surfaces of the substrate except for an electrical connection portion configured to be electrically connected to at least one of a driver circuit, a power source, a logic circuit, or a combination thereof.

15. A lighting fixture, comprising:

a lighting panel comprising a substrate comprising opposite first and second surfaces, a conductor pattern, and one or more apertures extending through the substrate from the first surface to the second surface;

a plurality of solid-state light emitters electrically connected to the conductor pattern;

a light-transmissive first protective layer covering at least a portion of the first surface of the substrate; and a second protective layer covering at least a portion of the second surface of the substrate, the first protective layer and the second protective layer being directly joined to one another through the one or more apertures of the substrate to assist in maintaining first protective layer and the second protective layer against the first and second surfaces of the substrate, respectively, one or both of the first protective layer and/or the second protective layer encapsulating the solid-state light emitters, the first and second protective layers and the substrate collectively having sufficient flexibility to permit opposite edges of the flexible lighting panel to be folded over on one another and/or to permit rolling of the flexible lighting panel into a tubular configuration; and a support structure configured to mount the flexible lighting panel and sufficiently rigid to maintain the flexible lighting panel in a planar state.

16. The lighting fixture of claim 15, wherein the support structure further comprises a housing containing a driver electrically connected to the lighting panel.

17. The lighting fixture of claim 15, wherein the support structure further comprises a panel support structure configured to retain the lighting panel in a planar state.

18. The lighting fixture of claim 17, wherein the panel support structure comprises an overhang that extends over peripheral edges of the lighting panel.

19. The lighting fixture of claim 15, wherein the first protective layer and the second protective layer are joined with one another through the apertures of the substrate by thermally fusing the first and second protective layers together.

20. The lighting fixture of claim 15, further comprising adhesive joining the first protective layer and the second protective layer to one another through the apertures of the substrate.

* * * * *